United States Patent
Maruyama et al.

(10) Patent No.: US 6,806,723 B2
(45) Date of Patent: Oct. 19, 2004

(54) CONTACTOR HAVING CONTACT ELECTRODES FORMED BY LASER PROCESSING

(75) Inventors: Shigeyuki Maruyama, Kawasaki (JP); Keisuke Fukuda, Kawasaki (JP); Naoyuki Watanabe, Kawasaki (JP); Takumi Kumatabara, Kawasaki (JP); Naohisa Matsushita, Kawasaki (JP); Masayuki Imakado, Kawasaki (JP); Kyohei Tamaki, Kawasaki (JP); Hiroshi Nozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/369,705

(22) Filed: Feb. 21, 2003

(65) Prior Publication Data

US 2004/0032272 A1 Feb. 19, 2004

(30) Foreign Application Priority Data

Aug. 14, 2002 (JP) .................................. 2002-236526

(51) Int. Cl.$^7$ .............................................. G01R 31/02
(52) U.S. Cl. ....................... 324/754; 324/761; 324/762; 219/121.66; 72/342.1
(58) Field of Search ................................ 324/754, 755, 324/758, 761–762, 765, 158.1; 72/38, 342.1, 342.5, 342.6, 342.94; 219/121.65, 121.66, 121.73, 121.78, 121.79, 121.85

(56) References Cited

U.S. PATENT DOCUMENTS

| | | | |
|---|---|---|---|
| 5,228,324 A | * | 7/1993 | Frackiewicz et al. ....... 72/342.1 |
| 5,719,374 A | * | 2/1998 | Frackiewicz et al. .. 219/121.66 |
| 6,245,444 B1 | * | 6/2001 | Marcus et al. .............. 428/616 |
| 6,442,831 B1 | * | 9/2002 | Khandros et al. ............. 29/843 |
| 6,640,604 B2 | * | 11/2003 | Matsushita ................. 72/342.1 |

FOREIGN PATENT DOCUMENTS

| | | |
|---|---|---|
| EP | 0 790 502 A2 | 8/1997 |
| JP | 63-303237 | 12/1988 |
| JP | 2-220714 | 9/1990 |
| JP | 5-245543 | 9/1993 |
| JP | 388948 | 5/2000 |

\* cited by examiner

*Primary Examiner*—Minh N. Tang
(74) *Attorney, Agent, or Firm*—Westerman, Hattori, Daniels & Adrian, LLP

(57) ABSTRACT

Contact electrodes having a predetermined shape are formed by irradiating a laser beam onto the contact electrodes that are formed of a conductive material. The laser beam can be irradiated, after joining an end of each contact electrode opposite to a contact end to a contact board, so as to deform the contact electrode so that the contact end is located at a predetermined position. The laser beam may be irradiated while heating or cooling a portion of the contact electrode opposite to a portion onto which the laser beam is irradiated.

28 Claims, 16 Drawing Sheets

CONTACTOR HAVING CONTACT ELECTRODES FORMED BY LASER PROCESSING

CROSS-REFERENCE TO RELATED APPLICATIONS

The present invention is based on Japanese priority application No. 2002-236526 filed Aug. 14, 2002, the entire contents of which are hereby incorporated by reference.

BACKGROUND OF THE INVENTION

1. Field of the Invention

The present invention generally relates to contactors for testing electronic devices and, more particularly, to a contactor having contact electrodes which make a contact with terminals of an electronic device such as a semiconductor substrate (wafer) or a wiring board so as to perform an electrical test on the electronic device.

2. Description of the Related Art

In recent years, miniaturization of wiring and densification of circuits have been progressed in semiconductor devices such as, for example, a large-scaled integrated circuit chip (hereinafter referred to as LSI) so as to satisfy the demand for downsizing or upgrading of a product to which the LSI is incorporated. With such progression, miniaturization of LSI terminals and increase in the number of terminals are progressing rapidly.

For example, development is progressing so that the terminals of an LSI chip used by SIP (System In Package) may attain a pitch of about 20 $\mu$m. Moreover, for the SIP application, the thickness of LSI chips has been rapidly reduced from, for example, 500 $\mu$m to 100 $\mu$m, 50 $\mu$m or even 25 $\mu$m. Accordingly, the following subjects are imposed also to contactors (probes) used for testing such an LSI chip.

1) It is necessary to develop immediately a contactor (probe) which can provide a good position accuracy ($\pm 5$ micrometers or less) in association with the miniaturization and increase in the number of LSI terminals.

2) Since LSIs become thinner, there is a possibility of breakage when an excessive contact force is applied thereto. For this reason, it is indispensable to control variation in a spring force of a probe to be as small as possible.

3) The area array type LSI has been increasing as arrangement of LSI terminals (terminals are arranged like a lattice over the whole area of LSI chip), and the contactor must correspond to the area array type LSI. That is, not only the conventional peripheral type LSI (terminals are arranged in the periphery of an LSI chip) but also the area array type LSI (terminals are arranged like a lattice over the whole area of an LSI chip) has been increasing, and a contact probe used for such an area array type LSI must have a higher density of electrodes than a probe for the peripheral type LSI. Thus, generally it is difficult to arrange and form the needles of the contactor.

4) In the case of a CSP (chip-size package) which has small pitch terminals or area array terminals, even for a packaged LSI, it has become difficult to maintain a previous cost of a contactor (socket) manufactured by a conventional technique.

There are two kinds of probe card systems.

A: Cantilever System (for peripheral type)

The cantilever system is a mainstream system in wafer probe cards. With respect to the structure of a probe of the cantilever system, ends (unbent side) of rod-like conductive members (needles) having bent ends are joined to terminals of a wiring board so that the bent ends of the rod-like members are pressed manually using an elongated tool so as to locate the bent ends within a desired range of position accuracy. The pitch of the ends on the wiring board side tends to be larger than that of the chip contact (needle tip)

B: Vertical Probe System (for area array type)

Since it is necessary to arrange pins in the shape of a lattice, a plurality of pins are arranged on a board fundamentally in a state where the pins are stood vertically to the board. However, if the pins are simply arranged vertically, the pins may contact with each other since a direction of bending of each pin, when it is pressed while being contacted with an LSI, cannot be the same. Thus, in a mainstream structure, the pins are previously bent in a predetermined direction. In order to make the pins stood together in large number, it is difficult to maintain a position of each pin while bending. Thus, the cost of the vertical probe system is more than twice the cantilever system.

A) Problems in the Cantilever System

I) There is a limitation in reducing the pitch.

A pitch of about 45 $\mu$m is a limit since it is difficult to attain a positional accuracy of the needle tips (XY accuracy: less than $\pm 5$ $\mu$m). As mentioned above, the final adjustment of the position of the needle tips is carried out by a small displacement by mechanical contact pressurization. There is an actual example in which the needle tip accuracy ($\pm 10$ $\mu$m) is attained for the level of pitch of about 45 $\mu$m. However, it is difficult to deal with a smaller pitch for the following reason.

(1) The distance between the needles is so small that a tool for position adjustment cannot be inserted.

(2) Even if the tool is inserted forcibly, it is difficult to maintain a movable area in which the needle tip can be displaced. Considering the spring back of the needle, it is impossible to maintain the movable area for obtaining a required displacement due to a relationship with adjacent needles.

II) It is difficult to obtain a uniform force with a narrow pitch.

Similar to the A) cantilever system, it is difficult to perform a work to adjust the height of the needle tips. If the needles are mechanically pressurized so as to adjust the height, a pressing tool tends to interfere with adjacent pins, which deteriorates easiness of work.

III) Basically, It cannot be applied to an area array type.

It is considered that a two-row arrangement is a limit.

B) Problems in the Vertical Probe System

I) there is a processing limit in a narrow pitch.

Although a pitch of more than 150 $\mu$m is mainly in use now, there is the same problem as A) cantilever system. That is, since there are adjacent pins on the right and left sides and front and back sides, which pins are obstructive, it is very much difficult to carry out a position correction with a high accuracy after the pins are formed on a board.

II) It is difficult to obtain a uniform force for a narrow pitch. Similar to A) cantilever system, it is difficult to adjust the pins in the same height.

III) Cost is high.

Since the adjacent pins becomes more obstructive as the pitch becomes smaller, it becomes difficult to perform a bending process (formation of bent portion), thereby inevitably increasing a manufacturing cost. Although there is a means to mount needles, which are previously bent, it is difficult to position the needles with the same direction of bending, thereby an increase in the manufacturing cost cannot be avoided.

C) Socket for CSP (Area Array of the Vertical Probe System)

Basically, there are problems similar to the problems of the above-mentioned B) vertical probe system. Additionally, it is necessary to plant small pins in a main part of a mold with higher accuracy as the pitch is decreased. The guide for pins, which accurately aligns the needle tips with the package terminals, requires a higher accuracy than a processing accuracy required for a conventional socket. In the case of CSP which uses solder balls as terminals, deformation of the solder balls become remarkable even when a contact pressure is slightly increased. Since the diameter and volume of each ball is decreased as the pitch becomes smaller, the degree of influence due to reduced pitch becomes remarkable, which causes a serious problem.

Thus, similar to the position accuracy of the pins, it is a subject to achieve a uniform contact force and reduce an increase in the cost. In order to solve the problems in the manufacturing methods of the conventional contactors as mentioned above, the applicants considered manufacturing a contactor suitable for a purpose of a prove by deforming needles or pins of the contactor using a laser bending technique.

As a conventional laser processing technology, the autumn convention academic lecture collection paper of the Japanese Society of Precision Engineering discloses on page 166 a laser processing technology which is considered to be applicable to a laser bending technique under the title "micro-forming of thin film metal glass by laser local heating". Conventionally, laser processing has not been used for manufacture of contactors, especially for the processing method of a probe card. This is because although the laser processing technology is not particularly needed since the conventional technology was applicable in some degrees, there was a problem that desired processing cannot be performed with a simple technology that simply irradiates a laser beam.

In other applications, there are examples in which laser bending using a laser is used. However, the reason for the difficulty of application of laser processing to the manufacture of probes for LSIs or fine wiring boards is that these probes have an extremely fine or micro structure (for example, a tip has a diameter of less than 30 micron). Additionally, a plurality of small pins are arranged at a very small pitch (for example, less than 50 micron), and a high accuracy is required for the position of each pin (at least ±10 $\mu$m). Although there were examples of applications to a bending process of individual parts or to a material or a board material having a width of a few millimeters, it was difficult to obtain a required processing or configuration by merely using a laser processing condition of other applications.

The following problems existed as the problems to be solved when applying the conventional laser technology to the processing of probes.

1) It was difficult to obtain displacement with high accuracy. If the resolution and variation in energy of laser irradiation are large, an unexpected large formation may occur in the probe.

2) In many cases, there was a restriction in a direction of irradiation to achieve bending in a desired direction. For example, it was desirable to carry out laser irradiation from an opposite direction, when an excessive deformation has occurred, so as to return the excessive deformation, however, there was an irradiation barrier and also production efficiency was low.

3) In order to obtain a high accuracy, an irradiation time period had to be elongated, thereby deteriorating production efficiency. Even if energy unit for irradiating a laser beam can be reduced, it took a long time to achieve a large deformation. Thus, production efficiency was low in a probe card having many pins, and there was a problem in that a manufacturing cost and a manufacturing time are very much larger than a conventional manufacturing method.

4) Many materials used for needles of a probe card especially in 3) are special materials, and metal materials (a tungsten alloy such as tungsten or tungsten rhenium) having a high hardness and a high melting point are mainly used. In order to obtain a desired displacement with such a meal material, a large energy must be applied to a part to be deformed until the part becomes a temperature at which the part is in a melted or half-melted state (when heat radiation to atmosphere is taken in consideration). However, with such a large energy, it was difficult to perform a fine displacement control after reaching a temperature close to a melting point and it becomes sensitively displaceable in response to the input energy.

5) Many probe needles have a rod-like shape, and their surfaces to which a laser is irradiated are curved surfaces. For this reason, relationships between an amount of laser irradiation and each of a displacement and a direction of displacement were hardly predicted, and it was difficult to displace the probe needles to target positions. Especially, many probe needles have a configuration in which a diameter decreases toward an end thereof, and, thus, a radius of curvature varies in response to a distance from a needle tip, which makes it difficult to positively displace with one's aim.

SUMMARY OF THE INVENTION

It is a general object of the present invention to provide an improved and useful manufacturing method of a contactor in which the above-mentioned problems are eliminated.

A more specific object of the present invention is to provide a manufacturing method of a contactor in which contact electrodes having a predetermined shape are formed by irradiating a laser beam onto the contact electrodes that are formed of a conductive material.

In order to achieve the above-mentioned objects, there is provided according to one aspect of the present invention a manufacturing method of a contactor for making a contact with electrodes of an electronic component, the manufacturing method comprising a step of forming at least one contact electrode by irradiating a laser beam onto the contact electrode made of a conductive material so as to deform the contact electrode in a predetermined shape.

According to the above-mentioned invention, the contact electrode of the contactor can be deformed not by mechanical processing but in a non-contact manner. Thus, a contactor having many contact electrodes arranged at a small pitch can be easily produced without physical restriction due to mechanical processing.

In the manufacturing method of a contactor according to the present invention, the step of forming the contact electrode may include a step of irradiating a laser beam, after joining an end of the contact electrode opposite to a contact end to a contact board, so as to deform said contact electrode so that the contact end is located at a predetermined position. Additionally, the laser beam may be irradiated while heating or cooling a portion of the contact electrode opposite to a portion onto which the laser beam is irradiated. Further, a plurality of the contact electrodes may be attached to a contactor board in an aligned and upright state, and thereafter the laser beam may be irradiated onto one of the contactor electrodes located at an end of a row in an upper oblique direction so as to bend the one of the contactor electrodes in the laser irradiating direction, and, then, the laser beam may be irradiated onto an adjacent contact electrode in the same row in the same direction as the direction of the laser beam irradiated onto the one of the contact electrodes located at the end of the row so as to bend the adjacent one of the contact electrodes, and repeats the laser irradiation until all of said contact electrodes are bent. Additionally, a plurality of the contact electrodes may be attached to a contactor board, and, thereafter, the laser beam may be irradiated onto each of the contact electrodes in a state in which the contactor electrodes are pressed against a flat plate to deform the contact electrodes, thereby aligning ends of the contact electrodes at the same level.

Additionally, there is provided according to another aspect of the present invention a contactor for making a contact with electrodes of an electronic component, comprising: a contactor board; and at least one contact electrode having a portion deformed by laser processing.

In the above-mentioned invention, the contact electrode may have a flat portion, and the contact electrode may be deformed by a laser beam irradiated onto the flat portion. additionally, the contact electrode may have a center portion made of a first conductive material, the second conductive material having a melting point and a hardness higher than that of the first conductive material.

Additionally, there is provided according to another aspect of the present invention a method of repairing a contact electrode of a probe card in a non-contact manner, the method comprising the step of irradiating a laser beam onto the contact electrode, which has been deformed, so as to restore the contact electrode in an original shape before deformation.

According to the above-mentioned invention, even if one of the contact electrodes is deformed, the deformed contact electrode can be restored to an original shape by only irradiating a laser beam, and, therefore, the contactor can be continuously used.

Additionally, there is provided according to another aspect of the present invention a prober for testing an electronic component, comprising: a probe card having at least one contact electrode; a placement stage on which a test material is placed, the test material being contacted by the contact electrode of the probe card; and a laser irradiating unit attached to the placement stage, wherein when said contact electrode is deformed, a laser beam is irradiated by the laser irradiating unit so as to deform the contact electrode, thereby restoring an original shape before deformation.

According to the above-mentioned invention, even if one of the contact electrodes is deformed, the deformed contact electrode ca be repaired on the prober. Additionally, there is no need to provide separately a repair apparatus.

Other objects, features and advantages of the present invention will become more apparent from the following detailed description when read in conjunction with the accompanying drawings.

DETAILED DESCRIPTION OF THE PREFERRED EMBODIMENTS

Figure 1A:
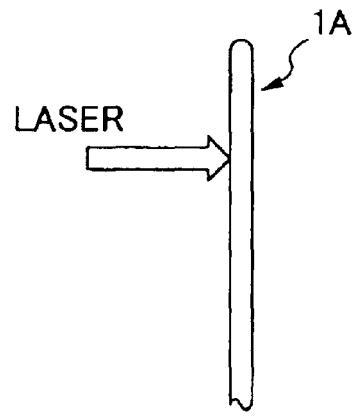
FIGS. 1A and 1B are illustrations for explaining bending of a contact electrode according to a basic idea of the present invention.

The present invention provides a highly accurate bending process using laser irradiation to a probe needle, and enables laser processing or working applicable to processing of a probe needle by the following method. It should be noted that, the following items 1)–4) correspond to 1)–4) of the subject when the above-mentioned conventional laser technique is applied to processing of a probe.

1) Obtain Highly Accurate Displacement.
  (1) Make energy unit small on a laser irradiating side. Specifically, a laser beam having a short wavelength such as 355 nm ultraviolet laser.
  (2) Control an amount of energy which a probe needle receives.
  a) Provide a filter.
  b) Vary a distance between a convergent lens and a probe needle so as to adjust the level of focus.
  That is, the energy to be received is maximum in a well-focused state, and the energy to be received decreases in response to the distance when the distance is changed from the well-focused state. (It is in inverse proportion to the square of distance.)
  (3) Control a deformation rate at the time of receiving the same energy.
  a) Control a temperature of a portion other than a laser irradiated portion (mainly opposite side). A high temperature is used if it is desired to decrease the deformation rate, and a low temperature is used if it is desired to increase.
  This is mainly for the reason that the bending by laser irradiation occurs due to a temperature difference between a front side and a back side in a state where the laser irradiated side is melted and the temperature of the melted portion higher than the opposite side and when the melted portion rapidly solidifies.

2) Enables bending in either concave or convex in the same irradiation direction.
  Bend occurs normally toward the irradiation side, however, bending toward a side opposite to the irradiation side can be achieved by varying the energy efficiency of the laser beam to irradiate.
  (1) Shift a lens and/or a processing object from a focal position. Although it bends toward the irradiation side in the focused state, it bends toward the opposite side if an offset is provided.)
  (2) Shorten an irradiation time (pulse width) extremely.
  (3) Carry out bending mechanically in a fixed direction under a high-temperature atmosphere beforehand, and carry out (1) and (2).
  (4) Generate a residual stress by applying a tension under a high-temperature atmosphere beforehand, and carry out (1) and (2).
  The approaches of (3) and (4) can achieve the inversion of the direction in bending easier than when the approach of (1) or (2) is carried out sorely. (The bending direction depends on a balance between a force to return to an original shape when receiving a small energy since a working strain remains in a portion mechanically bent at a high temperature, a state where a tension stress and a compression stress are opposed to each other is maintained, or a tension strain remains.)

3) Enables a dual-mode control of an area to be processed with a large deformation rate and an area to be processed with a small deformation rate. For example, switch to the approach used in 1) in the middle.
  Specifically,
  (1) Adjust a magnitude of focus by varying a distance between a convergent lens and a probe needle. The deformation rate of the needle is reduced by initially processing in a well-focused state and moving the lens or the processing object (needle) in the middle of the processing.
  (2) Control a temperature of a portion (mainly opposite side) other than a portion being irradiated. A backside of the irradiated portion is cooled in the initial stage of the processing, and switched to a room temperature or high temperature in the middle of the processing. As for a specific approach of the temperature control, there is easily achieved an approach in which a temperature-controlled fluid (inert gas) is blown.
  It may also be an effective approach that a large portion of deformation is simply bent mechanically beforehand, and, then, a laser beam is irradiated in a final process of achieving an accuracy. In such a method, depending on a temperature in the previously bending process, the effects the same as 2) bending in either concave or convex with the same irradiation direction.

4) Fundamentally, solved by the same idea as 3).
  Furthermore, the deformation rate according to laser irradiation can raise efficiency by providing a peculiar wavelength and pulse width to the material. A laser having a long wavelength, which can obtain a large amount of heat, is preferable for the conditions of the laser which is irradiated onto a tungsten alloy such as tungsten or tungsten rhenium. Anyway, since the melting point is high, combined use with preheating means or cooling the side opposite to the irradiated side is useful.

5) (1) Fabricate a probe needle by a plate-like material. Although laser irradiation becomes easy, other problems may occur. What is necessary is just solve the problems separately. For example, there is a problem such as an insufficient strength or a contact flaw.
  (2) Stably deform the needle having a rod shape. At least one flat surface is provided supposing a laser beam is irradiated. If there are one at the top and one each on left and right side, position correction with respect to X, Y, and Z directions can be achieved.
  (3) Concentrate an irradiated laser beam into a small spot, and repeat an operation of irradiating the center of the needle and an operation of irradiating end portion so as to achieve a high accuracy of needle position. First, a laser beam is irradiated onto an end portion. Since the area heated is small, the deformation rate is large. Fine correction can be adjusted by irradiating the laser beam near the center of the needle having a rod shape.

A correspondence table may be prepared for an amount of offset and a deformation rate for each radius of curvature, or it may be useful to irradiate a laser beam with multiplication of a correction factor when an amount of offset is input.

A description will now be given, with reference to the drawings, of embodiments of the present invention.

Figure 1B:
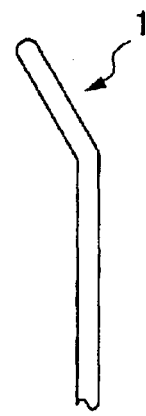

FIGS. 1A and 1B are illustrations for explaining bending of a contact electrode according to a basic idea of the present invention. By irradiating a laser beam onto a portion of a needle-like conductive material 1A which turns to a contact electrode 1 as shown in FIG. 1A, the contact electrode, which is bent toward the laser irradiation side, can be formed as shown in FIG. 1B. The laser beam may be irradiated onto a portion of the contact electrode to be bent a plurality of times along the direction of width, or the laser beam may be irradiated by being scanned in the direction of width.

The above-mentioned laser processing is a processing method using a melted deformation which occurs when the material solidifies by being cooled after the laser irradiated surface is heated and turn to a half-melted state. There is less influence than a bending process according to normal mechanical processing (bending, pressing), and a contact electrode 1 having an excellent spring characteristic.

In the present invention, the contact electrode is deformed in a predetermined shape. Here, the term "shape" means the configuration of the electrode which is accurately bent by a laser beam, and also means the configuration of the end of the contact electrode obtained after a laser beam is irradiated onto the previously shaped contact electrode so as to accurately adjust the position of the end of the contact electrode.

Moreover, since it is a non-contact bending, there is no possibility of interference of a bending tool or the like with adjacent contact electrodes, and, thus, an accurate bending process can be performed even if the contact electrodes 1 are aligned with a small pitch. Moreover, since there is no spring back occurs such as in the mechanical processing, there is no need to retain a space for unnecessary displacement.

Figure 2A:
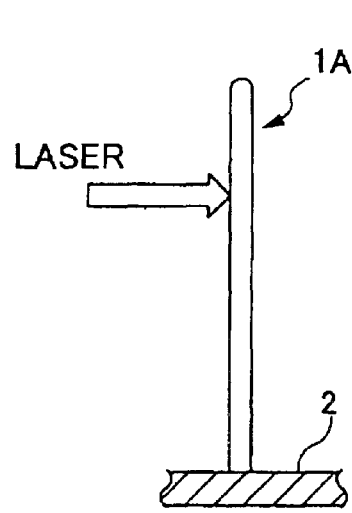
FIGS. 2A and 2B are illustrations for explaining a laser-bending process in a state in which a contact electrode is attached to a board.
Figure 2B:
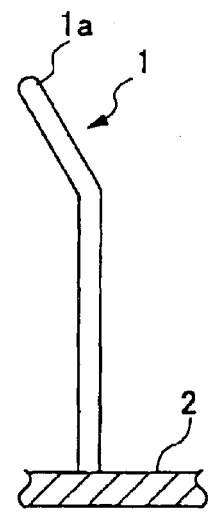

In many probe cards, the root of the contact electrode 1 is joined to a contactor substrate 2 as shown in FIG. 2B. According to bending using laser processing, the contact electrode 1 having a desired shape can be formed by bending by irradiating a laser beam onto the conductive material 1A after joining the conductive material 1A to the contactor board 2 as shown in FIG. 2A. Additionally, the position of an end 1a (a contacting portion) of the contact electrode 1 can be corrected by irradiating a laser beam.

It is preferable that the conductive material 1A is made of tungsten or a tungsten alloy including tungsten rhenium. Moreover, the conductive material 1A may be made of an alloy including a platinum group metal such as platinum (Pt) or palladium (Pd).

Figure 3A:
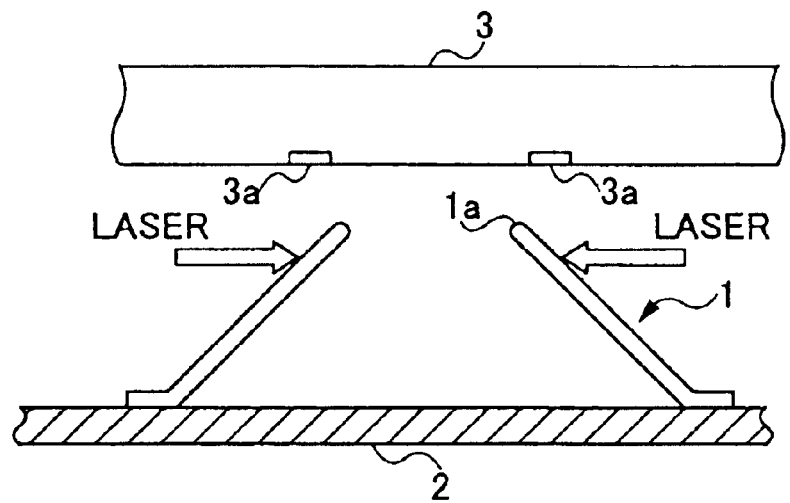
FIGS. 3A and 3b are illustrations for explaining a method of positional correction of the end of a slanting contact electrode by laser processing.
Figure 3B:
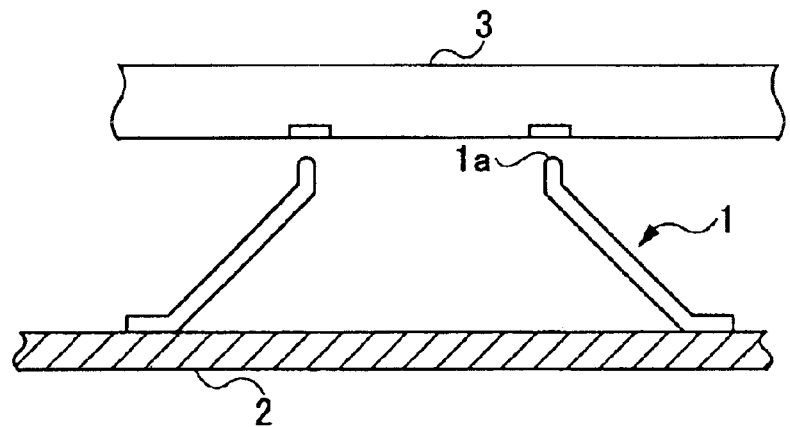

FIGS. 3A and 3B are illustrations for explaining a method of positional correction of the end of a slanting contact electrode by laser processing. The contact electrode 1 shown in FIG. 3A is bent beforehand at the root thereof, and is attached to the contactor board 2 in the state where it inclined to the contactor substrate 2. Although it is an example constituted so that the contact electrode 1 is brought into contact elastically due to an elasticity given by slanting, in the state shown in FIG. 3A, the positional accuracy of the end 1a of the contact electrode 1 is low and cannot make a contact with a terminal 3a of an LSI 3 which is an object to be contacted. Thus, as shown in FIG. 3B, a laser beam is irradiated near the end of the contact electrode 1 so as to perform a bending process so that the end 1a is aligned with the terminal 3a of the LSI 3. The thus-formed contact electrode 1 can be accurately brought in contact with the terminal 3a of the LSI 3, and an oxide film or foreign matters on the terminal 3a of the LSI 3 can be removed since the end of the contact electrode 1 moves forward slightly after the contact. In respect of adjusting an amount of such a forward movement, the high accuracy of bending provides effectiveness.

Figure 4A:
FIGS. 4A through 4D are illustrations for explaining a method of adjusting a position of the end of the contact electrode finally by laser processing after bending the end of the contact electrode in some degrees in the example shown in FIG. 3.
Figure 4B:
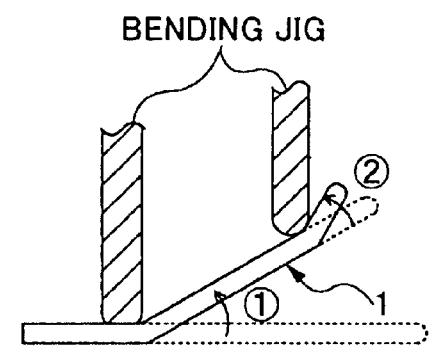
Figure 4C:
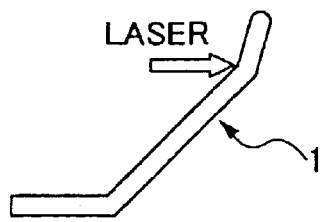
Figure 4D:
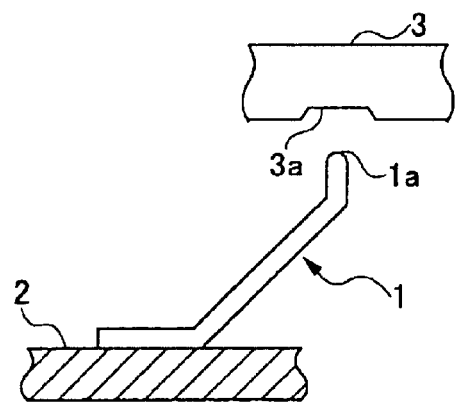

FIGS. 4A through 4D are illustrations for explaining a method of adjusting a position of the end 1a of the contact electrode 1 finally by laser processing after bending the end of the contact electrode in some degrees in the example shown in FIG. 3. That is, the straight conductive material 1A shown in FIG. 4A is bent previously as shown in FIG. 4B by a bending jig or the like. In the example shown in FIG. 4, the bending of the root which is fixed to the board 2 and the bending near the end 1a which contacts an object to be contacted are achieved by mechanical processing. It is difficult to accurately position the end 1a by mechanical processing due to a spring back of the bent portion. Thus, after attaching the contact electrode 1 to the contactor board 2, a laser beam is irradiated onto the bending part near the end 1a, as shown in FIG. 4C, so as to perform laser processing to move the end 1a to a desired position. Then, the contact electrode 1 is attached to the board 2 to form a probe card as shown in FIG. 4D. The laser bending may be performed before attaching the contact electrode 1 to the board 2, or may be performed after the attachment.

Figure 5:
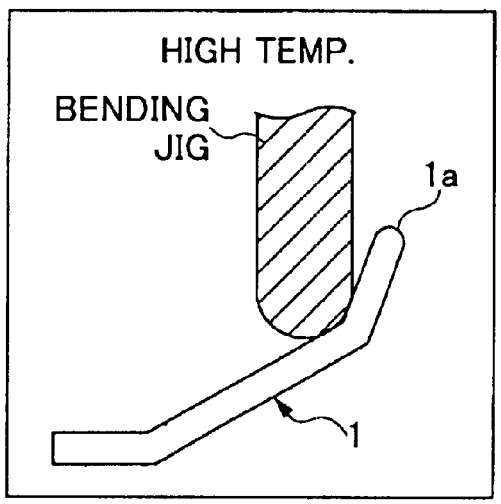
FIG. 5 is an illustration for explaining a method of generating a high-temperature processing strain in a contact electrode.

The machine bending applied near the end 1a of the contact electrode 1 shown in FIGS. 4A through 4D is preferably performed under a high-temperature atmosphere (higher than a room temperature) as shown in FIG. 5. That is, a hot working strain is generated in the contact electrode 1 by performing machine bending under a high-temperature atmosphere. The material having a hot working strain can be bent in a direction opposite to the direction of laser irradiation by appropriately controlling the conditions of laser irradiation. Therefore, even in a case where the degree of bending is too large, bending can be performed in the reverse direction of the laser irradiation direction by irradiating a laser beam, that is, deformation can be achieved in a direction to return the bent. Such laser bending process in the reverse direction is important. When a plurality of contact electrodes 1 stand up adjacently, the adjacent contact electrodes may become obstructive and laser irradiation from opposite direction from bending may not be able to be performed. Even if it is such a case, it can bend or return the bend by irradiation in the same direction.

Figure 6:
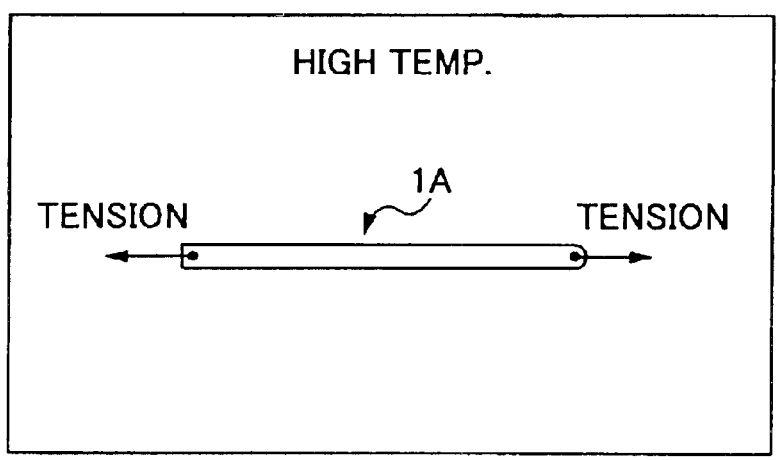
FIG. 6 is an illustration for explaining a method of generating a high-temperature processing strain in a contact electrode.

Moreover, the high-temperature working strain can be generated in the conductive material 1A also by annealing the conductive material 1A under a high-temperature atmosphere while applying a tension stress to the conductive material 1A as shown in FIG. 6. Thereby, the contact electrode 1 can be bent in a reverse direction of the laser irradiating direction.

Figure 7:
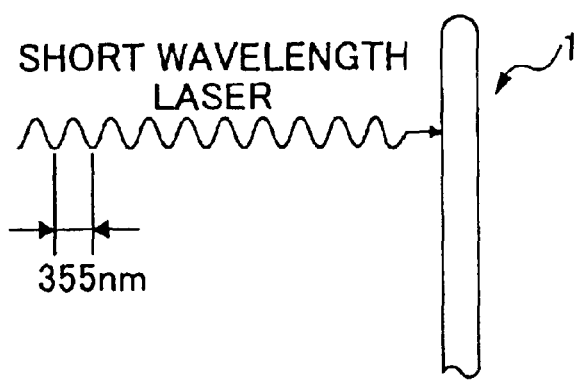
FIG. 7 is an illustration for explaining a wavelength of a laser bream.

Here, as a laser beam irradiated so as to bend the contact electrode 1, an ultraviolet laser having a short wavelength is suitable as shown in FIG. 7. The heat energy at the time of irradiation is smaller as the wavelength of the laser is shorter. For example, if an ultraviolet-light laser having a wavelength of 355 nm is used, a fine needle can be bent without being melted by irradiating the ultraviolet laser beam onto the tine needle having a very small heat capacity. Moreover, a contact electrode having a fine needle-like shape can be processed by irradiating a laser beam while cooling the contact electrode if necessary. Furthermore, by irradiating a single wavelength laser beam for a short time, an amount of deformation obtained by one time irradiation can be small. Thus, a resolution of bending can be small, which result in a fine control of a bending angle.

Figure 8:
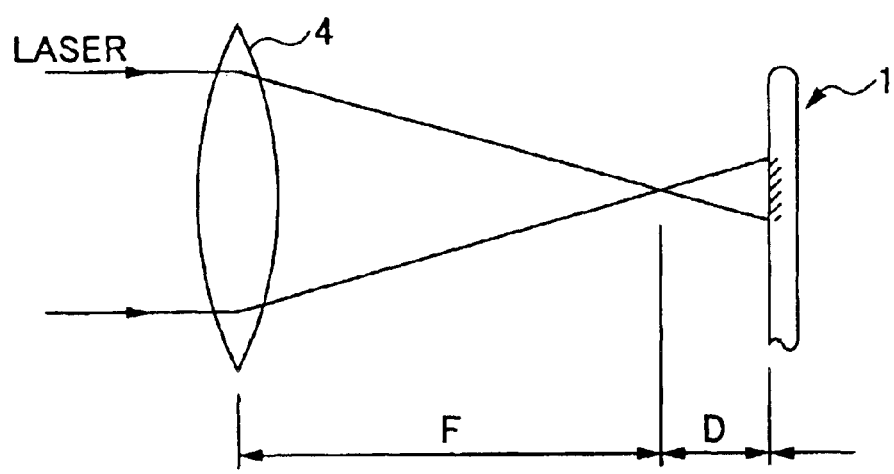
FIG. 8 is an illustration showing an example of irradiating a laser beam, converged by a lens, onto the contact electrode.

FIG. 8 is an illustration showing an example of irradiating a laser beam, converged by a lens, onto the contact electrode 1. In order to improve the laser bending accuracy of the contact electrode 1, a laser beam is converged by a convergent lens 4 and is irradiated onto a desired portion of the contact electrode 1. At this time, the opposition of the contact electrode 1 is intentionally shifted from a focal distance F of the convergent lens 4 be an offset distance D (defocused) so as to a power density of the laser beam being irradiated. Although a power density is maximum when the contact electrode 1 is in at the position of the focal distance F, the power density decreases as the offset distance D increases. It is necessary to determine an optimum value of the offset distance D in consideration of conditions such as a kind of laser beams, a material and a diameter of the contact electrode and a bending angle.

Additionally, the bending process can be controlled with a higher accuracy by controlling a temperature of an opposite portion of the laser-irradiated portion of the contact electrode while adjusting the power density of the laser beam. Especially, the reverse direction bending is achieved by irradiating a focused laser beam while blowing high-temperature controlled gas onto the opposite portion of the laser-irradiated portion.

Figure 9:
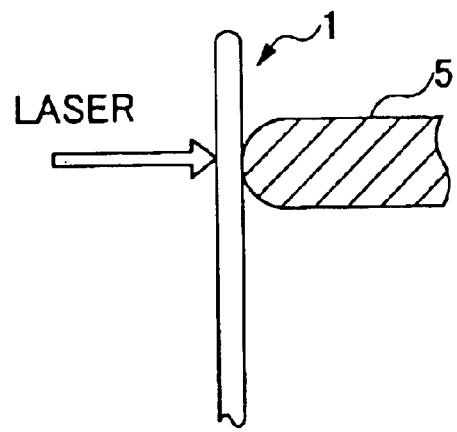
FIG. 9 is an illustration showing an example which irradiates a laser while heating a contact electrode.

FIG. 9 is an illustration showing an example which irradiates a laser while heating a contact electrode. In the example shown in FIG. 9, a control is performed so that a temperature difference between laser-irradiated portion and the opposite portion is reduced by contacting a heating member 5 such as a heater with the opposite portion, which is opposite to the laser-irradiated portion. In such conditions, if it is the same laser irradiation conditions, an amount of bents (bending angle) will become small.

Figure 10:
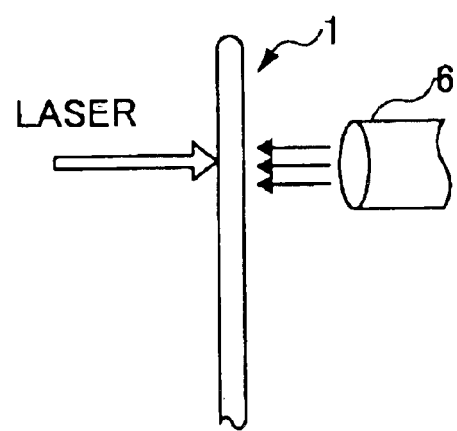
FIG. 10 is an illustration showing an example which controls the temperature of a contact electrode by a fluid.

FIG. 10 is an illustration showing an example which controls the temperature of a contact electrode by a fluid. In the example shown in FIG. 10, an inert gas (nitrogen) of which temperature is controlled is used as a fluid for controlling the temperature of the contact electrode 1. That is, the temperature difference between the laser-irradiated portion and the opposite portion is controlled by blowing an inert gas from a nozzle 6 to the opposite portion of the laser-irradiated portion of the contact electrode 1. If the temperature of the inert gas is higher than a room temperature, the amount of bents become small, and if it is lower, the amount of bents become large. The reason for using an inert gas is for preventing oxidization of the contact electrode 1 at the time of being heated by laser irradiation. When there is no need to prevent oxidization, air may be used instead of an inert gas.

Figure 11:
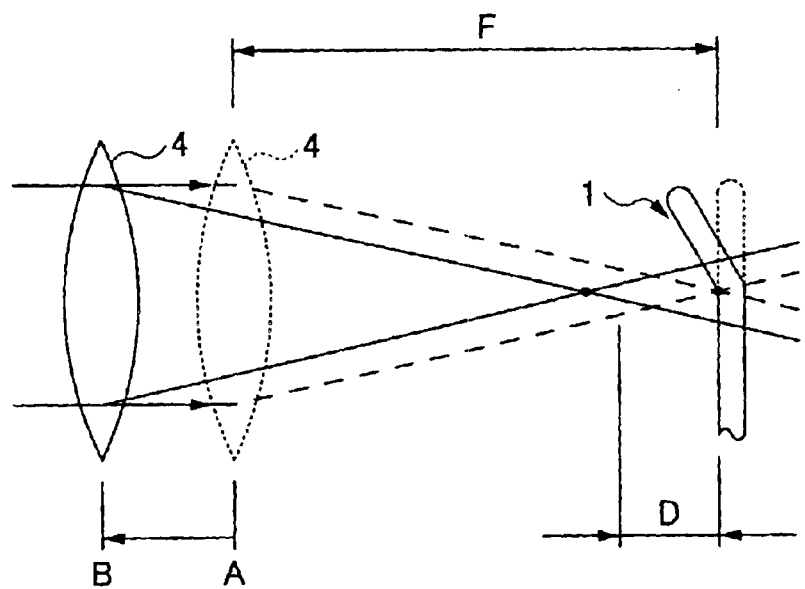
FIG. 11 is an illustration for explaining an example which speeds up laser bending.

FIG. 11 is an illustration for explaining an example which speeds up laser bending. In the example shown in FIG. 11, a laser beam is irradiated onto the contact electrode 1 while converging the laser beam using the convergent lens 4 as shown in FIG. 8. At this time, initially, the contact electrode 1 is positioned at the focal distance F of the convergent lens 4. A state where the convergent lens 4 is located at a position A in FIG. 11 corresponds to the state where the contact electrode 1 is positioned at the focal distance F. When the bending of the contact electrode has progressed to a certain degree, the convergent lens 4 is moved away from the contact electrode 1 so as to locate at a position B. Thereby, the focal position of the convergent lens 4 moves to a position ahead of the contact electrode (defocused), and the focal position is shifted by the offset distance D as shown in FIG. 8. Consequently, the power density of the laser beam irradiated onto the contact electrode 1 is reduced, thereby reducing an amount of bents.

That is, at the initial stage, the laser beam is irradiated at a maximum power density by setting the distance between the convergent lens 4 and the contact electrode 1 to be the focal distance F so as to bend the contact electrode 1 with a maximum amount of bending (maximum bending rate), and, then, after the bending has progressed to a certain degree, the convergent lens 4 is moved so as to defocus the laser beam so that the power density is reduced, which results in reduction in the amount of bending (bending rate). Thereby, when a desired amount of bending (bending angle) is approached, the bending rate can be made small which achieve a fine control of a final bending angle.

As other approaches of controlling a bending rate, the temperature control as shown in FIG. 9 or FIG. 10 may be used. That is, the temperature difference between the laser-irradiated portion and the opposite portion is set large initially, and after the bending has progressed to a certain degree, the temperature difference is set smaller, which can achieve reduction in the bending rate.

Figure 12:
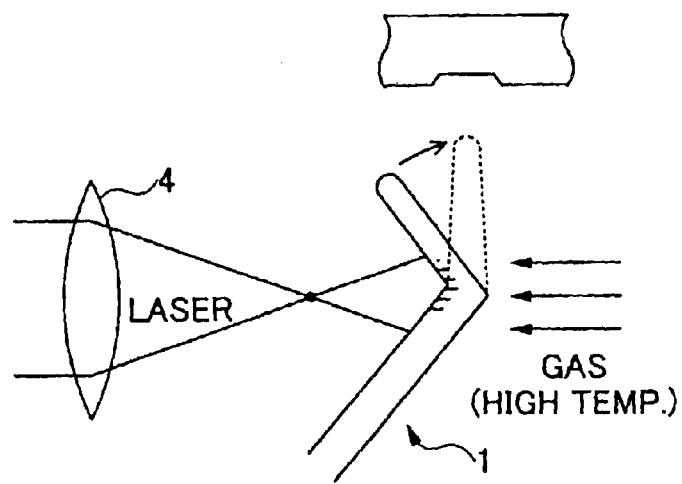
FIG. 12 is an illustration showing an example which performs a reverse-direction bending.

FIG. 12 is an illustration showing an example which performs a reverse-direction bending. As shown in FIG. 12, the reverse-direction bending can bend the contact electrode 1 in a direction opposite to the direction in which a laser beam is irradiated, by irradiating a defocused laser beam by the convergent lens 4 while blowing a high-temperature controlled gas to a portion opposite to a portion where the defocused laser beam is irradiated. Instead of carrying out the defocus of the laser beam the reverse-direction bending may be achieved by setting a laser irradiation time (pulse width) shorter than that for a normal-direction bending, preferably equal to or less than one half.

Figure 13:
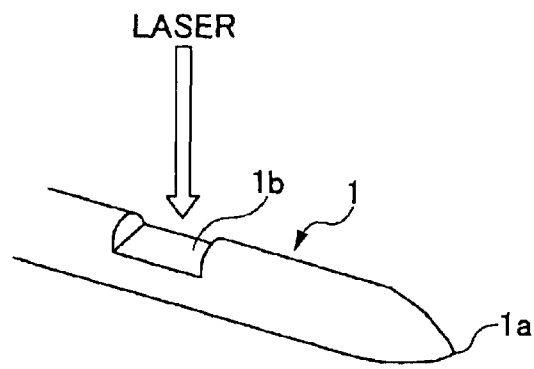
FIG. 13 is a perspective view of a contact electrode having a laser-irradiated portion formed as a flat surface.

FIG. 13 is a perspective view of a contact electrode having a laser-irradiated portion formed as a flat surface. In the contact electrode 1 shown in FIG. 13, a flat surface 1b is formed by cutting out a portion onto which a laser it irradiated to bend. Since the laser energy is absorbed more efficiently than irradiating onto a curved surface, an efficient bending process can be achieved. Moreover, since the laser-irradiated surface is a flat surface, a laser beam can be irradiated more uniformly than irradiating onto a curved surface, which achieves an accurate bending process.

The laser bending may be used not only for bending a portion near the end 1a of the contact electrode 1 but also for shaping the entire contact electrode. In such a case, a plurality of flat surfaces may be provided at appropriate positions of the contact electrode. Moreover, as shown in FIG. 14, an adjustment of position of the end 1a may be performed by irradiating a laser beam onto the flat surface 1b after bending the contact electrode near the end 1a.

Figure 14:
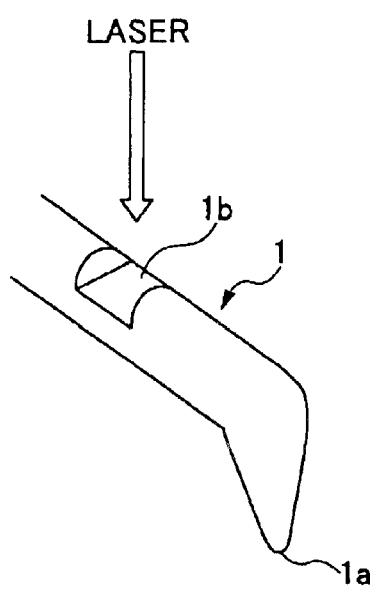
FIG. 14 is a perspective view of a contact electrode having a flat surface to correct a position of an end of the contact electrode which is previously bent.
Figure 15:
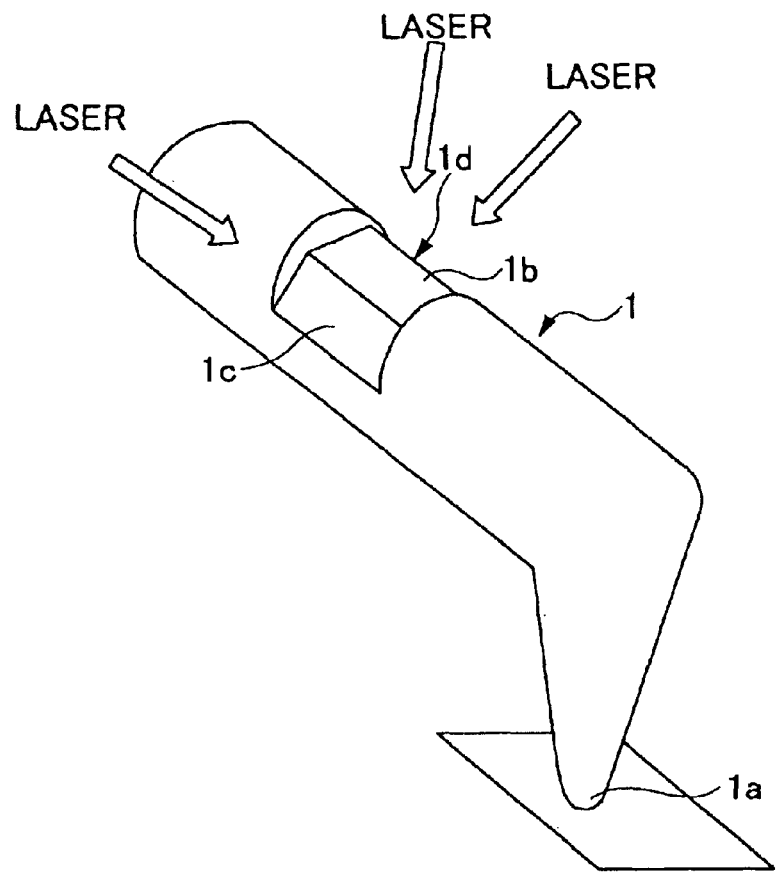
FIG. 15 is a perspective view of the conductive electrode shown in FIG. 14 which is provided with a plurality of flat surfaces.
Figure 16:
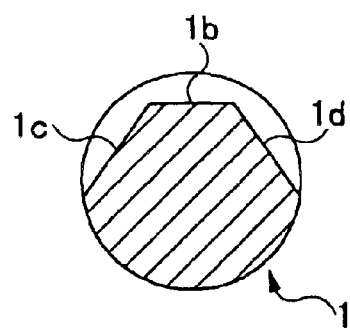
FIG. 16 is a cross-sectional view of the contact electrode shown in FIG. 15 taken along a portion provided with the flat surfaces.
Figure 17:
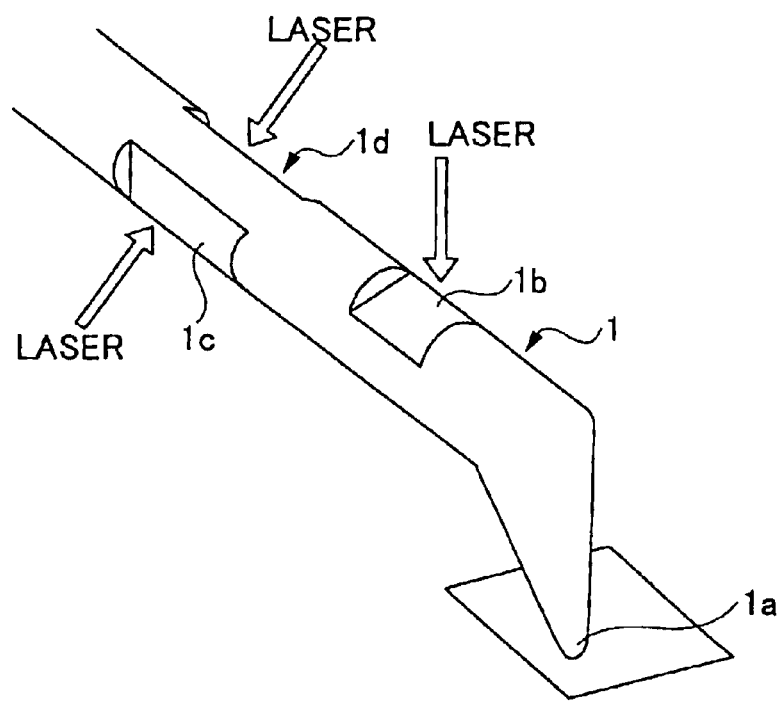
FIG. 17 is cross-sectional view of the contact electrode shown in FIG. 14 which is provided with a plurality of flat surfaces in different positions.

FIG. 15 is a perspective view showing an example in which a flat surface is further provided on each side of the flat surface 1b of the contact electrode shown in FIG. 14. The flat surfaces 1c and 1d are provided on both sides of the flat surface 1b, respectively. Thus, the contact electrode 1 can be bent in a plurality of directions (upward and downward directions and rightward and leftward directions in FIG. 15) by irradiating a laser beam onto each of the flat surfaces if necessary. Moreover, the plurality of flat surfaces can also be formed in different positions individually as shown in FIG. 17. It should be noted that the number of flat surfaces is not limited to three, and a necessary number of flat surfaces may be formed.

Figure 18:
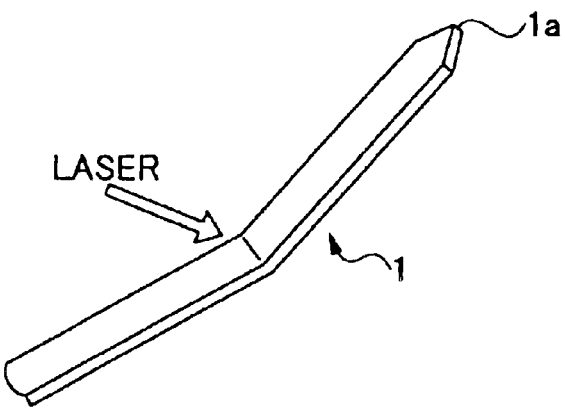
FIG. 18 is a perspective view showing an example in which a contact electrode is formed of a plate material.

FIG. 18 is a perspective view showing an example in which the contact electrode is formed of a plate material. If the conductive member which forms the contact electrode 1 is made of a metal plate material, a laser beam can be irradiated onto a flat surface without forming particularly a flat surface. In this case, although the laser bending is easy, if the thickness of a plate is small, there is a possibility that strength is insufficient. In such a case, it is needed to reinforce the contact electrode in a direction of width. However, if the contact electrode can be formed by punching a thick plate material, the contact electrode may be used without reinforcement.

Figure 19:
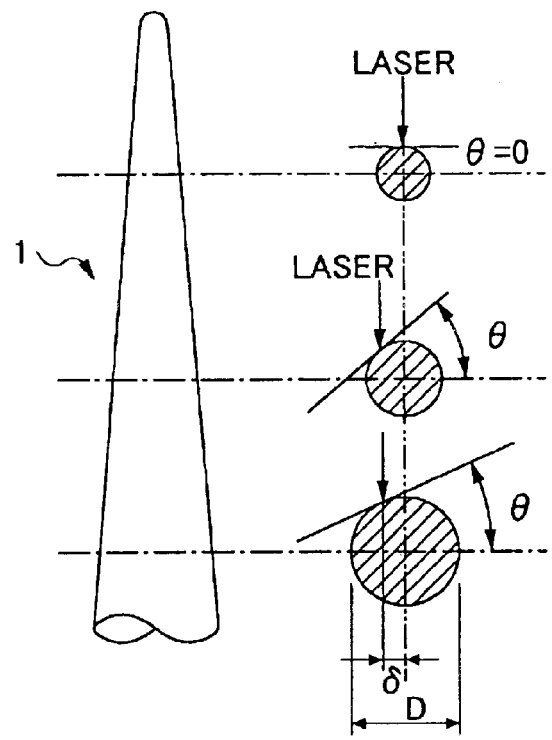
FIG. 19 is an illustration for explaining a condition of laser irradiation to a contact electrode having a rod shape.

FIG. 19 is an illustration for explaining a condition of laser irradiation to a contact electrode having a rod shape. In FIG. 19, cross-sectional views are indicated aside of a side view of the contact electrode 1. The contact electrode 1 shown in FIG. 19 is formed of a rod-like material gradually thinned toward an end thereof. The laser to be irradiated is converged so as to be a beam diameter (spot) smaller than the diameter of the contact electrode, and irradiated on the contact electrode 1. In this case, if a laser beam is irradiated onto a canter portion of the contact electrode 1, an energy absorption efficiency of the laser beam is increased. On the other hand, if the laser beam is irradiated onto an eccentric position, it corresponds to a state where the laser beam is irradiated in an oblique direction, which reduces the energy absorption efficiency.

That is, an irradiation loss becomes larger as an angle θ of a tangent of the contact electrode at a laser-irradiated point increases as shown in FIG. 19. Thus, a standard of a correction factor is created based on an eccentricity δ/D of the position of the laser-irradiated position. Here, D is a diameter of the contact electrode 1 in at the laser-irradiated position, and δ delta is the eccentricity of the laser-irradiated position.

However, although the laser beam irradiated onto one side end of the contact electrode 1 has a low energy absorption efficiency similar to that irradiated onto a slanting surface, the deformation may rapidly progresses depending on a size, a radius off curvature or material since a volume of the material to be heated on the side end is small. If the conditions of these bending conditions are beforehand checked by experiments and an efficiency table (conversion table) is produced for each condition, a laser-irradiated position for performing desired laser bending can be obtained easily.

Figure 20:
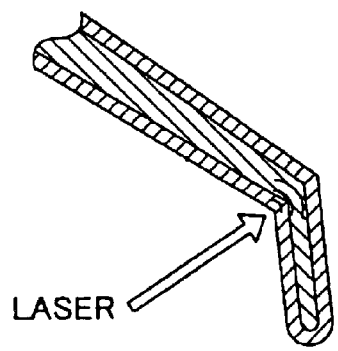
FIG. 20 is a cross-sectional view of a contact electrode having a central part and a peripheral part formed by different conductive materials.

FIG. 20 is a cross-sectional view of a contact electrode having a central part and a peripheral part formed by different conductive materials. Since the contact electrode is repeatedly brought into contact with an object to be contacted, a wear resistance is required for the contact electrode. If the entire contact electrode 1 is formed by a material having a high wear resistance and hardness, the contact electrode 1 may be hardly deformed by irradiation of a laser beam since a melting point is high. Thus, a contact electrode 1 is formed in a structure having a peripheral part 10 and a central part 11, as shown in FIG. 20, and the central part 11 is formed by a material having a lower melting point than the peripheral part 10. Thereby, the peripheral part 10 has a high wear resistance and the central part 11 is made of a material which can be easily deformed by laser processing, which enables formation of a contact electrode which can be easily processed by laser processing while maintaining a wear resistance.

Figure 21A:
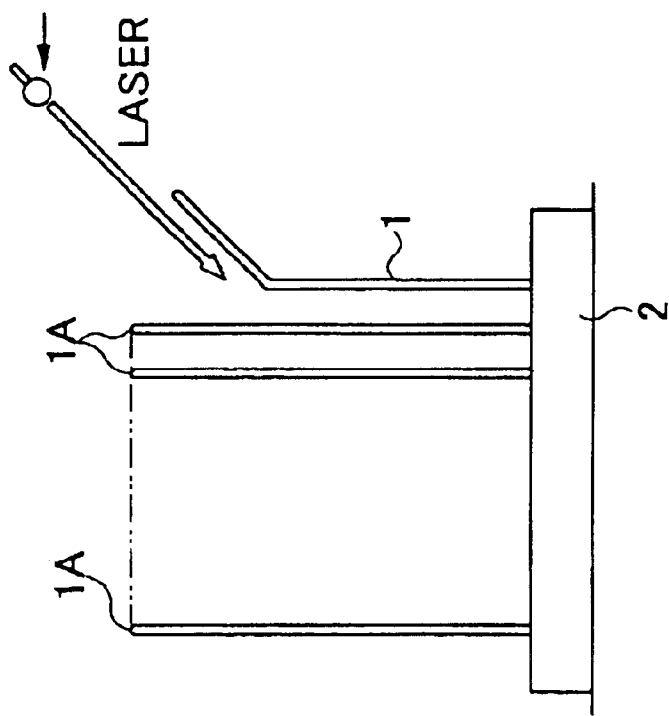
FIGS. 21A and 21B are illustrations for explaining a method of forming a probe for an area array by laser bending.
Figure 21B:
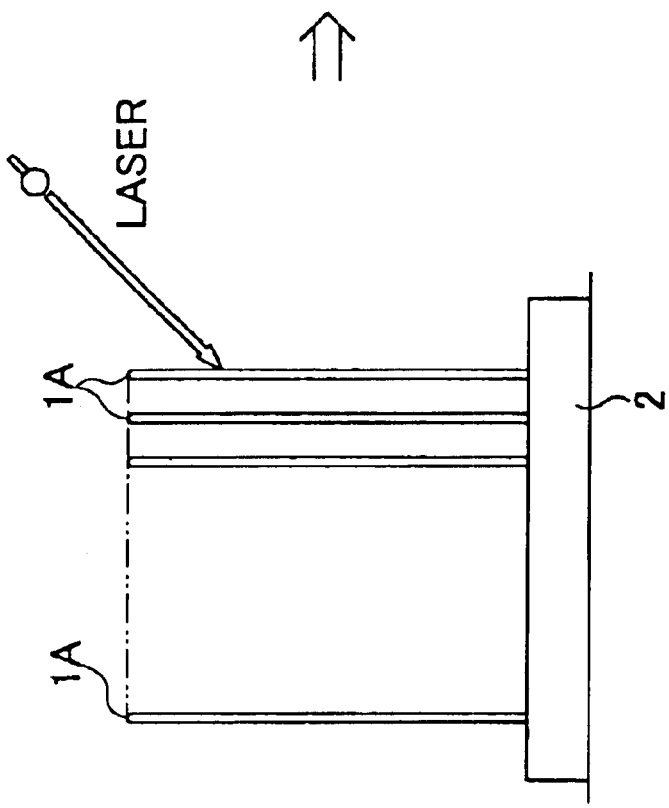

FIGS. 21A and 21B are illustrations for explaining a method of forming a probe for an area array by laser bending. First, needle-like conductive materials 1A, which are made into the contact electrodes 1, are attached to the board 2. Since the probe card for an area array must be provided with many contact electrodes 1 in a state where the contact electrodes is stood up and aligned, as shown in FIG. 21A, many conductive materials 1A are provided in a stand up and aligned state. Then, as shown in FIG. 21B, the conductive materials 1A are bent in a laser irradiating direction by irradiating a laser beam onto each of the conductive materials sequentially from the end. After bending one of the conductive materials 1A, a space can be reserved for irradiating a laser beam onto the adjacent conductive material 1A. Thereby, the contact electrodes 1, which are bent in the same direction and the same angle, are obtained by sequentially irradiating a laser beam.

Figure 22:
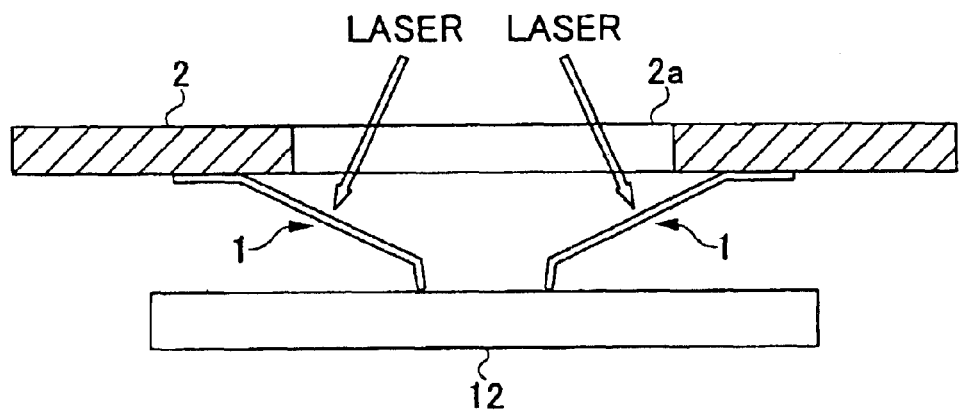
FIG. 22 is an illustration for explaining an example of a method of making the contact electrodes in the same height.

FIG. 22 is an illustration for explaining an example of a method of making the contact electrodes in the same height. The contactor shown in FIG. 22 is of a peripheral type, and a plurality of contact electrodes 1 are provided as shown in FIG. 3. Here, the contact electrodes 1 can be deformed in a state in which the height of each of the contact electrodes is forcibly equalized by irradiating a laser beam onto each of the contact electrodes 1 through an opening 2a of the contactor board 2 in a state where the contact electrodes 1 are pressed against a flat plate 12 so that the contactor board is parallel to the flat plate 12.

Figure 23:
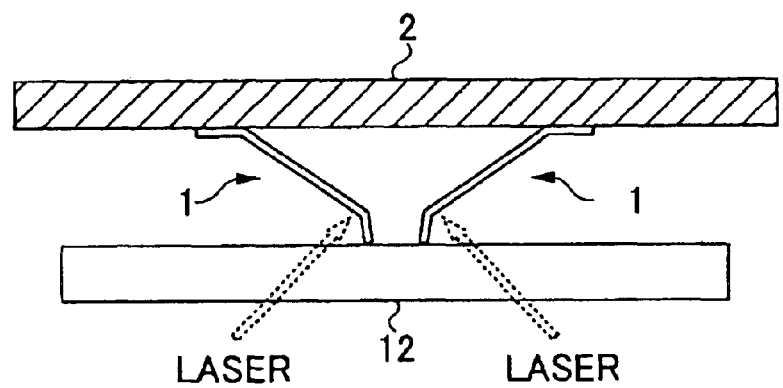
FIG. 23 is an illustration for explaining another example of the method of making the contact electrodes in the same height.

FIG. 23 is an illustration for explaining another example of the method of making the contact electrodes in the same height. Since the contactor board 2 shown in FIG. 23 does not have the opening 2a in the center thereof, a laser beam cannot be irradiated from the side of the contactor board 2. Thus, the flat plate 12 is formed by a laser transparent material so that a laser beam can be irradiated onto the contact electrodes by being passed through the flat plate 12.

As mentioned above, even the contactor, such as a contactor for an area array, which requires many contact electrodes arranged with a small pitch, can be formed easily with high accuracy by applying a bending process to the contact electrodes using a laser processing technique.

Moreover, the above-mentioned laser bending process can be used for position correction or repair of the contact electrodes. For example, although, conventionally, it may become impossible to use the whole probe card when one of many contact electrodes is bent due to an unusual pressure applied to the one of the contact electrodes, the probe card can be restored in a usable state by repairing the unusually deformed contact electrode by the laser processing.

A description will now be given of a wafer prober provided with a mechanism which restores a contact electrode by laser processing.

Figure 24:
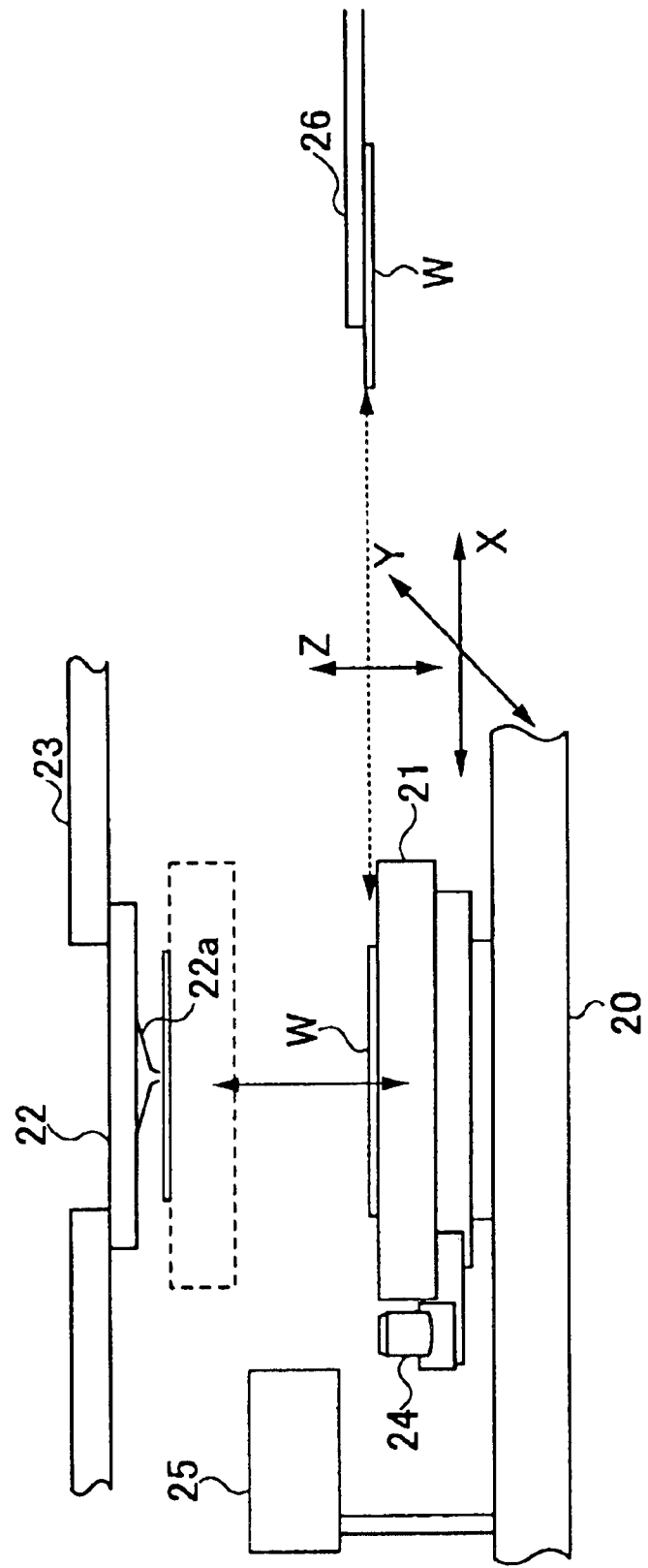
FIG. 24 is a side view showing a basic structure of a wafer prober.

FIG. 24 is an illustration showing a basic structure of a wafer prober. The wafer (LSI) W, which is an object to be tested, is attached to a chuck top table 21 fixed on a XYZ θ theta stage 20. The probe card 22 provided with contact electrodes 22a is attached to a probe card attachment part 23 which is provided above the chuck top table 21. The chuck top table 21 is provided with a camera 24 for recognizing position of a needle tip, and sends position information of the contact electrodes of the probe card to a wafer alignment part.

The wafer W conveyed by an arm 26 of a wafer conveyance mechanism (not shown in the figure) is placed on the chuck top table 21, and is fixed by vacuum suction. Then, the XYZθ stage 20 is driven so as to move the chuck top table 21 so that the contact electrodes 22a of the probe card 22 are aligned with electrodes of the LSI of the wafer W. At this time, a wafer alignment part 25 controls XY movement of the XYZθ stage 20 while recognizing the needle tip position of the contact electrode 22a by needle tip position recognition camera 24, and finally moves XYZθ stage 20 in Z-direction so as to contact the contact electrodes 22a of the probe card 22 with the electrodes of the LSI. Thereby, a test can be performed on the LSI of the wafer W.

Figure 25:
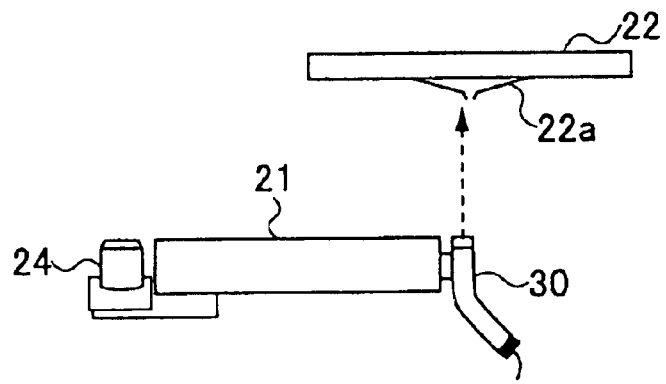
FIG. 25 is a side view of a chuck top table provided with a laser irradiation unit.

In the above-mentioned wafer prober, correction of needle tip positions of the contact electrodes 22a can be made on the wafer prober by irradiating a laser beam onto the contact electrodes 22a of the probe card 22. That is, as shown in FIG. 25, by attaching a laser irradiation device unit 30 to the chuck top table 21 and irradiating a laser beam onto the contact electrodes 22a of the probe card 22 fixed to the probe card attachment part 23, the contact electrodes 22a are deformed to as to correct the needle tip positions thereof. The correction of the needle tip positions of the contact electrode 22a is performed by irradiating a laser beam onto a desired position while driving the XYZθ stage 20 based on the position information supplied from the needle tip position recognition camera 24.

Figure 26:
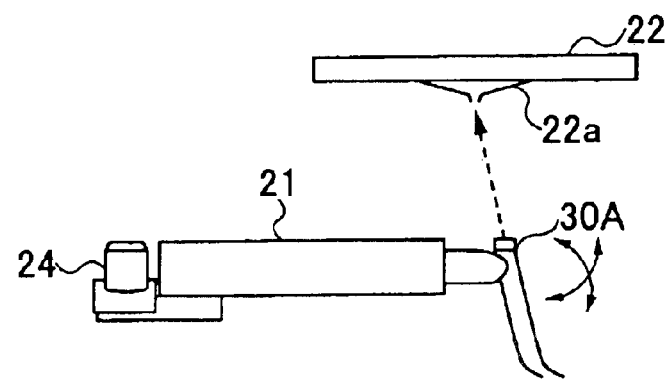
FIG. 26 is a side view of a variation of the chuck top table shown in FIG. 25.
Figure 27:
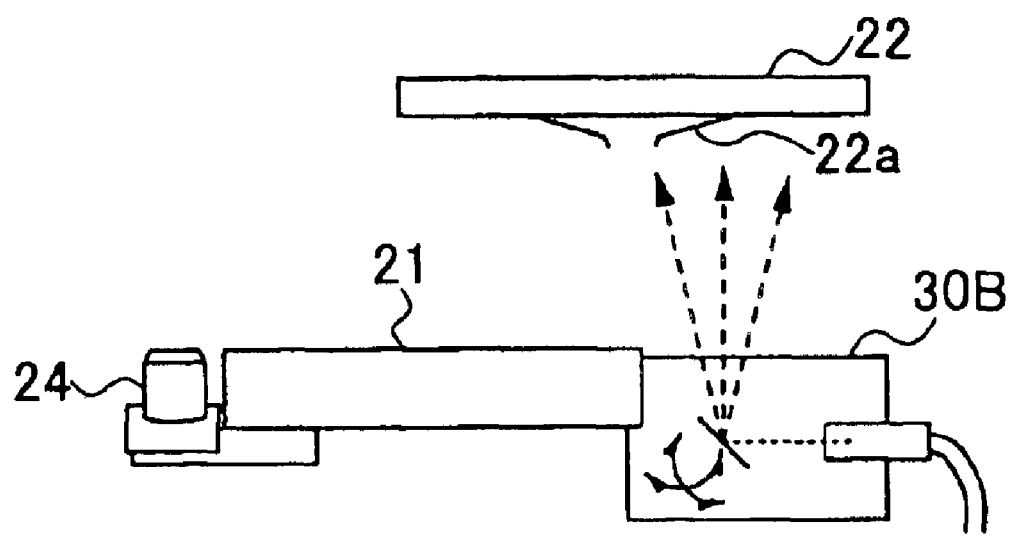
FIG. 27 is a side view of another variation of the chuck top table shown in FIG. 25.

It is preferable, as shown in FIG. 26, to constitute the laser irradiation device unit as a laser irradiation unit 30A, which can change an irradiation angle so that a laser beam can be irradiated onto the contact electrodes 22a in an oblique direction. Moreover, as shown in FIG. 27, the laser irradiation device unit may be provided with an optical system so as to be a laser irradiating unit 30B, which can change a direction of irradiation of a laser beam.

As mentioned above, when the correction of needle tip positions of the contact electrodes is performed on the wafer prober by providing the laser irradiation unit to the wafer prober, there is no need to provide a special correcting apparatus. Moreover, even a contact electrodes are deformed in use, the deformed contact electrodes can be immediately corrected on the wafer prober. Therefore, the time and effort to replace the prober or to convey the prober to a correcting device and attach again to the wafer prober can be eliminated.

The present invention is not limited to the specifically disclosed embodiments, and variations and modifications may be made without departing from the scope of the present invention.

What is claimed is:

1. A manufacturing method of a contactor for making a contact with electrodes of an electronic component, the manufacturing method comprising a step of forming at least one contact electrode by irradiating a laser beam onto the contact electrode having a rod-like shape and made of a conductive material so as to deform the contact electrode in a predetermined shape.

2. The manufacturing method as claimed in claim 1, wherein the step of forming the contact electrode includes a step of irradiating a laser beam, after joining an end of the contact electrode opposite to a contact end to a contact board, so as to deform said contact electrode so that the contact end is located at a predetermined position.

3. The manufacturing method as claimed in claim 1, wherein said contact electrode is subjected to a bending process before the laser beam is irradiated thereon.

4. The manufacturing method as claimed in claim 3, wherein the bending process is performed under a high-temperature atmosphere in which a high-temperature processing strain is generated in the contact electrode.

5. The manufacturing method as claimed in claim 1, wherein the conductive material to be formed in said contact electrode is annealed in a state where a tension force is applied to the conductive material.

6. The manufacturing method as claimed in claim 1, wherein the laser beam irradiated onto said contact electrode is an ultraviolet laser beam.

7. The manufacturing method as claimed in claim 1, wherein the laser beam is irradiated onto said contact electrode after being converged by a convergent lens so that a desired amount of deformation is achieved by varying a distance between the convergent lens and said contact electrode from a focal distance of said convergent lens.

8. The manufacturing method as claimed in claim 1, wherein the laser beam is irradiated while heating or cooling a portion of said contact electrode opposite to a portion at which the laser beam is irradiated.

9. The manufacturing method as claimed in claim 8, wherein the heating or cooling is performed by blowing air or inert gas.

10. The manufacturing method as claimed in claim 1, wherein an amount of deformation of said contact electrode is adjusted by changing a condition of irradiation of the laser beam during irradiation.

11. The manufacturing method as claimed in claim 1, wherein said contact electrode is bent in either a normal direction or an opposite direction opposite to the normal direction by changing a condition of irradiation of the laser beam which is irradiated in the same direction.

12. The manufacturing method as claimed in claim 11, wherein when bending said contact electrode in the opposite direction, the laser beam converged by the convergent lens is defocused.

13. The manufacturing method as claimed in claim 11, wherein when bending said contact electrode in the opposite direction, a portion of said contact electrode opposite to a portion at which the laser beam is irradiated is heated and an energy of laser beam irradiated onto said contact electrode is reduced to equal to or less than one half of an energy required for bending in the normal direction.

14. The manufacturing method as claimed in claim 13, wherein the amount of energy is reduced to equal to or less than one half by shortening a time of irradiating the laser beam to bend in the normal direction.

15. The manufacturing method as claimed in claim 1, wherein a least one flat portion is formed on said contact electrode, and the laser beam is irradiated onto the flat portion.

16. The manufacturing method as claimed in claim 1, wherein the conductive material forming said contact electrode has a rod shape having a curved outer surface, and when the laser beam is irradiated onto a portion of said contact electrode which is offset from a center axis of the rod shape, an energy of the laser beam is determined by multiplying an energy required for irradiating the laser beam onto a portion corresponding to the center axis by a deformation rate factor previously determined based on experiments.

17. The manufacturing method as claimed in claim 1, wherein said contact electrode has a center portion made of a first conductive material and an outer portion formed of a second conductive material different from the first conductive material, said second conductive material having a melting point and a hardness higher than that of said first conductive material.

18. The manufacturing method as claimed in claim 1, wherein a plurality of said contact electrodes are attached to a contactor board in an aligned and upright state, and thereafter the laser beam is irradiated onto one of said contactor electrodes located at an end of a row in an upper oblique direction so as to bend said one of said contactor electrodes in the laser irradiating direction, and, then, the laser beam is irradiated onto an adjacent contact electrode in the same row in the same direction as the direction of the laser beam irradiated onto said one of said contact electrodes located at the end of the row so as to bend said adjacent one of said contact electrodes, and repeats the laser irradiation until all of said contact electrodes are bent.

19. The manufacturing method as claimed in claim 1, wherein a plurality of said contact electrodes are attached to a contactor board, and, thereafter, the laser beam is irradiated onto each of said contact electrodes in a state in which said contactor electrodes are pressed against a flat plate to deform said contact electrodes, thereby aligning ends of said contact electrodes at the same level.

20. The manufacturing method as claimed in claim 19, wherein said flat plate is made of a material having transparency with respect to the laser beam, and the laser beam is irradiated onto said contact electrodes by being passed through the flat plate.

21. A contactor for making a contact with electrodes of an electronic component, comprising:
    a contactor board; and
    at least one contact electrode having a rod-like shape and having a portion deformed by laser processing.

22. The contactor as claimed in claim 21, wherein said contact electrode has a flat portion, and said contact electrode is deformed by a laser beam irradiated onto the flat portion.

23. The contactor as claimed in claim 21, wherein said contact electrode has a center portion made of a first conductive material and an outer portion formed of a second conductive material different from the first conductive material, said second conductive material having a melting point and a hardness higher than that of said first conductive material.

24. The contactor as claimed in claim 21, wherein said contact electrode is made of a tungsten alloy.

25. The contactor as claimed in claim 21, wherein said contact electrode is made of an alloy containing a platinum group metal.

26. A method of repairing a contact electrode of a probe card in a non-contact manner, the method comprising the step of irradiating a laser beam onto the contact electrode, which has been deformed, so as to restore the contact electrode in an original shape before deformation.

27. A prober for testing an electronic component, comprising:
 a probe card having at least one contact electrode;
 a placement stage on which a test material is placed, the test material being contacted by the contact electrode of the probe card; and
 a laser irradiating unit attached to the placement stage,
 wherein when said contact electrode is deformed, a laser beam is irradiated by said laser irradiating unit so as to deform said contact electrode, thereby restoring an original shape before deformation.

28. The prober as claimed in claim 27, wherein said laser irradiating unit is configured and arranged to be capable of changing a laser irradiating direction.

* * * * *